United States Patent [19]

Comer

[11] Patent Number: 4,777,471
[45] Date of Patent: Oct. 11, 1988

[54] APPARATUS FOR MULTIPLE LINK TRIMMING IN PRECISION INTEGRATED CIRCUITS

[75] Inventor: Donald T. Comer, Los Gatos, Calif.

[73] Assignee: Precision MicroDevices Inc., San Jose, Calif.

[21] Appl. No.: 64,675

[22] Filed: Jun. 22, 1987

[51] Int. Cl.$^4$ ............................................. H03K 13/02
[52] U.S. Cl. .................. 341/118; 307/299.2; 338/195
[58] Field of Search ................. 340/347 DA, 347 CC; 307/299 R, 299 B; 357/40; 338/195

[56] References Cited

U.S. PATENT DOCUMENTS 4,138,671  2/1979  Comer et al. ............... 340/347 DA
4,150,366  4/1979  Price ............................ 340/347 CC

OTHER PUBLICATIONS

"Laser Trimming on the Chip", Electronic Packaging and Production, S. Harris, pp. 50–56, Feb. 1975.
"Bipolar and Mos Analog Integrated Circuit Design", Chap. 2–3, 1984.
IEEE Journal of Solid State Circuits, vol. SC-10, No. 6, Dec. 1975, 412–416.
IEEE Transactions on Circuits and Systems, CAS-25, 504–509, Jul. 1978.

Primary Examiner—Vit W. Miska
Attorney, Agent, or Firm—Michael L. Harrison

[57] ABSTRACT

An improved circuit, and an improved device geometry for trimming element values in an integrated circuit employs selectable short-circuiting of fusible elements by means of application of a prescribed sequence of electrical waveforms of prescribed amplitude and polarity. The improved trim circuit configuration offers the possibility of improved trim circuit density by allowing selection of three trim elements from a single contact pad, in conjunction with a common contact pad, for each trim circuit. Replication of the circuits allows extension of the range of adjustment or of the resolution of the trim, at the expense of only one additional pad per each additional trim circuit. A unique device geometry is described for implementing the improved trim circuit within a single isolation pocket of an integrated circuit.

2 Claims, 3 Drawing Sheets

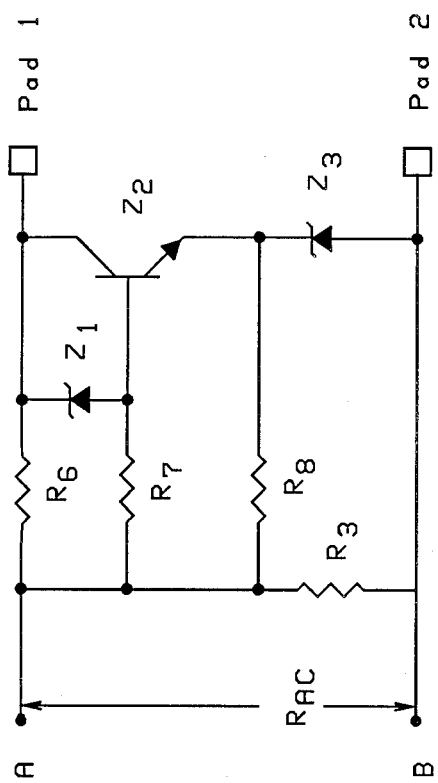
Fig. 4
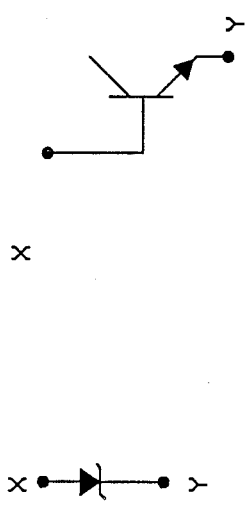
Fig. 3b
Fig. 3a

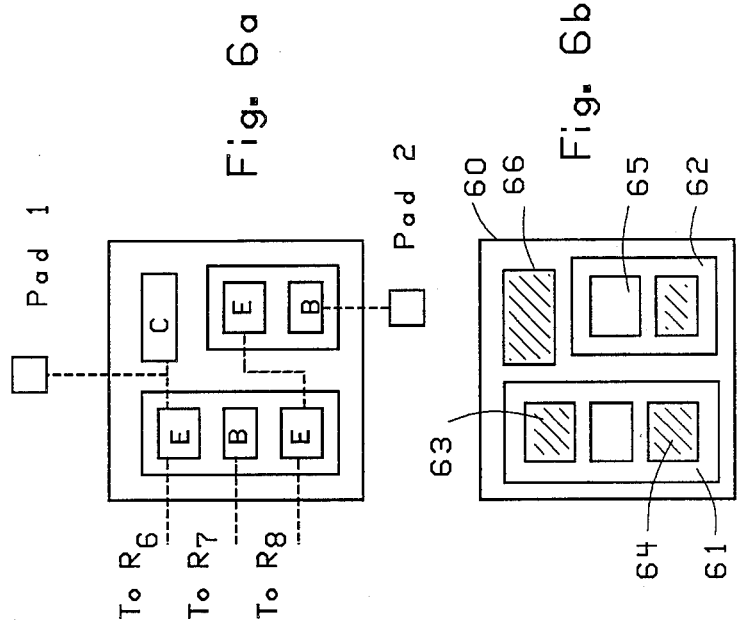
Fig. 6a
Fig. 6b
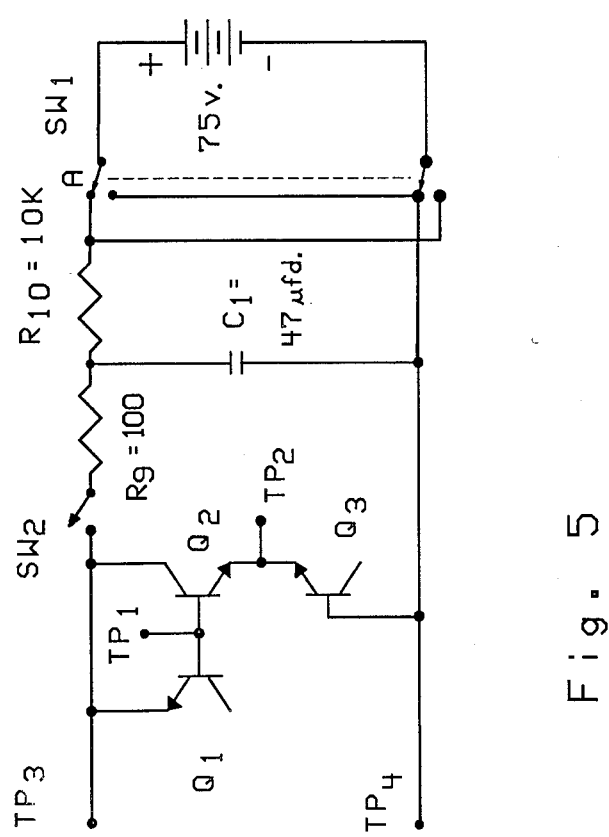
Fig. 5

APPARATUS FOR MULTIPLE LINK TRIMMING IN PRECISION INTEGRATED CIRCUITS

BACKGROUND OF THE INVENTION

1. Field of the Invention

The present invention relates to electronic circuitry and more particularly to trimming circuitry suitable for use with a variety of precision integrated circuits.

2. Prior Art

Most precision integrated circuits such as digital to analog converters or low off-set operational amplifiers require close matching of tolerances among resistor components. To manufacture integrated circuits having such close tolerances requires that devices be screened for tolerance mismatch, and that those devices which fall outside the tolerance range be discarded.

Since it is difficult to control and therefore to match resistor component values in the basic manufacturing processes, the yield achieved by screening and discarding alone would be unacceptably low, and would result in device costs which are prohibitive. To avoid this loss, it is common to trim critical elements after manufacture, to up-grade devices which might otherwise fall outside the required tolerance range to performance within acceptable tolerances.

A widely used method of trimming resistor elements on an integrated circuit utilizes a laser beam to modify resistor element values, as is well known. This method is well documented in the literature by, for example, S. Harris and D. Wagner, "Laser Trimming on the Chip", Electronic Packaging and Production, pp. 50–56, February, 1975 and Grebene, Alan: "Bipolar and MOS Analog Integrated Circuit Design", John Wiley and Sons, 1984, Chapters 2 and 3.

An alternative method, also well documented, employs fusible links to trim resistive elements on an integrated circuit. See, e.g.: G. Erdi : "A precision Trim Technique for Monolithic Analog Circuits", IEEE Journal of Solid State Circuits, Vol. SC-10 No. 6, December 1975, 412–416 and A. Grebene: "Bipolar and MOS Analog Integrated Circuit Design", John Wiley and Sons, 1984, Chapter 2 and 3. This method is generally utilized in applications requiring a limited number of trims or a limited trim range. This is because the area required to create each fusible link element must be permanently designed into the integrated circuit and can cause the overall size of a circuit which contains fusible link trimming to become much larger than the equivalent untrimmed design.

In the most rudimentary form of fusible link trimming, each fusible link is controlled by a single metal conductor which is accessed on the integrated circuit chip by a metal "pad" on the periphery of the chip. The physical size of the pad must be sufficiently large to allow connection to a "probe" terminal which is normally placed in contact with the pad during wafer test. A typical size for the metal pad is 0.004 inches square. In applications which require several trims, the entire periphery of the I.C. chip may become dominated by the trim pads, which can greatly effect the final chip size and hence dominate the final cost of the integrated circuit.

Attempts to utilize other techniques to create access to multiple fusible link elements have been successful to some extent, see, e.g., D. Comer, et al, Selectable Trimming Circuit for use with a Digital to Analog Converter, U.S. Pat. No. 4,138,671, issued Feb. 6, 1979, and D. Comer, A Monolithic 12-Bit Digital to Analog Converter, IEEE Transactions on Circuits and Systems, CAS-25, 504–509, July 1978. However, the extra circuitry required to gain access to each of several links nevertheless requires an undesirably large area to be utilized on the I.C. chip, either as bond pads or as special decoding circuitry.

SUMMARY OF THE PRESENT INVENTION

A need exists therefore for a circuit configuration which allows access to multiple fusible links while minimizing the extra area required on the integrated circuit chip to accomplish the trim.

The present invention accomplishes these and other objects by providing a circuit configuration which has a plurality of circuit elements, arranged in such a way that both polarity and sequence-sensitive selection and deliberate short-circuiting of elements may be utilized to adjust the overall value of a circuit having a combination of the circuit elements.

BRIEF DESCRIPTION OF THE DRAWINGS

FIG. 3 illustrates two alternative circuit representations of element used as shortable circuit elements.

FIG. 4 is a further improvement of a trim circuit in accordance with the present invention.

FIG. 5 illustrates the experimental circuit which is the basis of the test results described herein.

FIG. 6 illustrates a new device geometry for formation of the trim circuitry of the present invention within an integrated circuit.

DESCRIPTION OF THE PREFERRED EMBODIMENT

Figure 1:
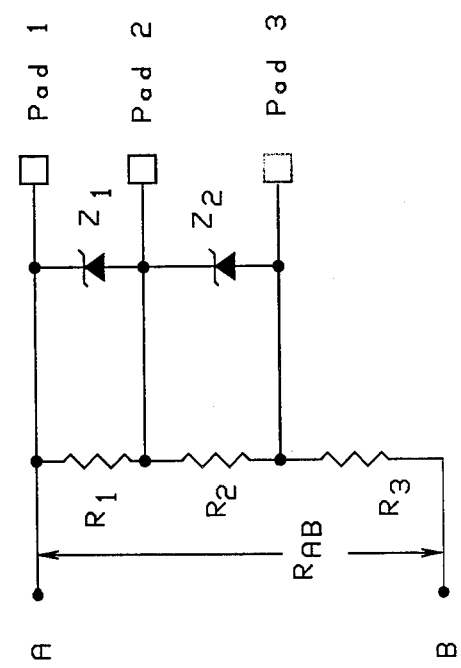
FIG. 1 shows a rudimentary trim circuit of the type known to the prior art.

Referring now to FIG. 1, there is shown a rudimentary trim circuit of the type known to the prior art, which utilizes avalanche breakdown fusible link trimming, commonly known in the industry as "Zener zap" fusible link trimming, as described by the references of Erdi and Grebene mentioned above.

Prior to treatment of the circuit of FIG. 1 by the Zener zap method, the effective resistance between terminals A,B is $$R_{AB} = R_1 + R_2 + R_3.$$

Diodes $Z_1$ and $Z_2$ are assumed to appear as an open circuit for signal levels substantially below the Zener threshold.

A temporary high current pulse of proper polarity applied between pads 1 and 2 will cause Zener diode $Z_1$ to conduct heavily by avalanche migration of the metal interconnect. If the current is sustained for the time required by the particular device's characteristics, relatively heavy power dissipation at the junction of the device can cause the junction to be permanently destroyed causing the Zener to become effectively shorted internally. In an integrated circuit, the metal in the contact window of the integrated circuit also melts and fuses into the silicon in the region between the cathode and anode contacts, thereby creating a permanent short circuit.

In FIG. 1, following a Zener zap as described, the effective resistance between terminals A,B would then become $R_{AB}=R_2+R_3$. Likewise, by the same mechanism, a high current pulse applied between pads 2 and 3 will result in the shorting of $Z_2$. For an example of the trimming possibilities which the circuit of FIG. 1 allows, assume that values are assigned to the resistors so that $R_3=5K$, $R_1=100$, $R_2=200$. For these values, $R_{AB}$ can be adjusted over a total range of 300 ohms, or a 6% range, with a resolution of 100 ohms, or 2%.

Figure 2:
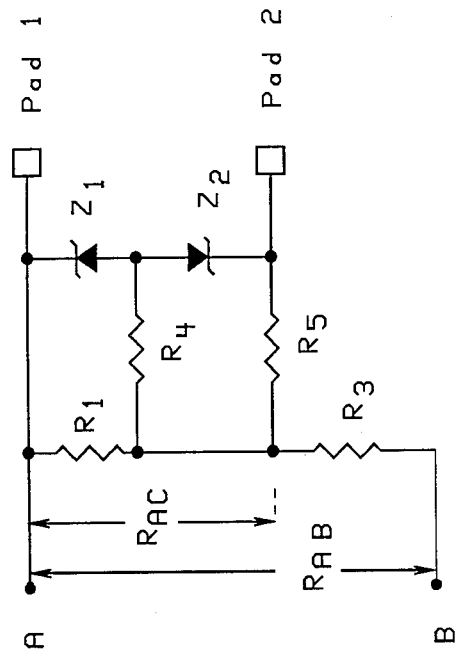
FIG. 2 shows an improved form of trim circuitry in accordance with the present invention.

FIG. 2 illustrates an improved trim circuit which embodies the teaching of the present invention. Note that the Zener diodes are "back-to-back" instead of in series as in the circuit of FIG. 1. Also, the value of resistor $R_2$ in FIG. 1 has been divided into two not-necessarily-equal parts, consisting of $R_4$ and $R_5$.

The circuit of FIG. 2 operates as follows. If a high current pulse is applied between pads 1 and 2 with conventional current flowing from 1 to 2, then diode $Z_1$ can be shorted by avalanche migration as described above. The effective resistance between terminals A and C is then $$R_{AC}=R_1R_A/R_1+R_A$$

If the polarity of the high current pulse is reversed, so that current flows from pad 2 to pad 1, current will be conducted through the previously shorted $Z_1$ and will cause shorting of $Z_2$ by avalanche migration.

After shorting of $Z_2$ the resistance $R_{AC}$ becomes $$R_{AC}=1/(1/R_1+1/R_4+1/R_5)$$

Thus, the use of different polarity currents employed in conjunction with the fact that a previously shorted Zener element can be used to access the second element results in two "zaps" being controlled from a single pad (with reference to a common pad). By comparison, the prior art scheme illustrated in FIG. 1 required two pads to control two zaps to a common pad.

It should be noted that in practice the fusible link elements are implemented as the emitter (cathode) and base (anode) of a small NPN vertical transistor device. The collector of the device may be shorted to the base or left floating. Thus a fusible link diode may be schematically shown as a diode or a transistor element as illustrated in FIG. 3.

In view of this equivalence, it is correct and meaningful to refer to the anode, for example, of the Zener diode in the NPN version as the base, and so forth. This equivalence is relied upon in the claims portion of this application to make the language general enough to cover both NPN and PNP versions. Thus, the emitter is the cathode of the NPN device and the anode of the PNP device, while the base is the cathode of the PNP device and the anode of the NPN device.

FIG. 4 shows a further improved trim circuit in accordance with the present invention. Referring now to FIG. 4., the first conduction of a high current from pad 1 to pad 2 will cause avalanche migration of element $Z_3$. Following the avalanche conduction by $Z_3$, it is effectively a short circuit causing resistor $R_8$ to shunt $R_3$. During the first conduction, transistor $Z_2$ will conduct current through its collector and effectively bypass element $Z_1$ from conducting high currents. Therefore element $Z_1$ will remain intact following the first zap current pulse. Also element $Z_2$ will be undamaged, since current flow through the device will be in its normal collector-base-emitter (forward biased) direction.

After $Z_3$ has been rendered a short circuit by avalanche breakdown following the first high current pulse, there is a low resistance path to current flow in the reverse direction. Thus, a second high current pulse flowing from pad 2 to pad 1 will cause avalanche migration of the base-emitter junction of $Z_2$, thereby causing $R_7$ to shunt $R_3$.

Finally, a third high current pulse applied so that conventional current flows from pad 1 to pad 2 will cause avalanche migration of $Z_1$, thus causing resistor $R_8$ to be shunted across $R_3$. In this case, the high current during migration will flow through already shorted elements $Z_1$ and $Z_2$. There will be no collector current flowing in $Z_2$ because transistor action will not take place after $Z_2$ is shorted base to emitter.

The circuit of FIG. 4 illustrates additional principles of the invention of this disclosure. The first is the use of the collector terminal of a Zener zap element to selectively "protect" other zap elements for certain polarities and sequence of zap pulses. By proper selection of polarity and sequence of current pulses, one can now control multiple zap elements from a single pad in conjunction with a common pad.

For example, in the improved trim circuit of FIG. 4, a single pad, Pad 1, in conjunction with a common pad, Pad 2, was used to control three distinct trim increments. Since this approach permits multiple trims from a single pad and the method of trimming by avalanche migration is commonly referred to as "Zener Zap", the trim circuit shown in FIG. 4. can be referred to as a "Multi-Zap" trim circuit.

As in prior art Zener zap trim applications, it is necessary to place the selectable breakdown elements with proper polarity and at low level bias points in the circuit so that an "unzapped" element will appear as an open circuit. In the most typical applications, such as operational amplifier offset trimming or digital-to-analog converter linearity trimming, the trim nodes are biased with a dc polarity. For example, in the circuit of FIG. 1, if conventional direct current is assumed to flow from terminal A to terminal B, the voltage across $R_1$ and $R_2$ will be in such a direction to reverse bias zap elements $Z_1$ and $Z_2$. Therefore, they will appear as "open circuits" if no trim is intended. In practice, temperature dependent leakage current may be observed, but for typical devices and bias levels this current is in the picoamp range and can be neglected.

In order to achieve simultaneously the most range and resolution for a given number of independent elements, it is common practice in the prior art to weight each zap element binarily. For example, in the circuit of FIG. 1, if zap 1 is set to trim one unit and zap 2 is set to trim two units, then the range of trim is 3 units, the resolution is one unit, and the maximum residual error after trim will be $+\frac{1}{2}$ if the untrimmed error is within the trim range.

In general, the following equations apply to N independent binarily weighted zap trims, assuming $Z_1$ corresponds to the "least significant" trim of $T_1$ units:

Range $=(2N-1)T_1$
Resolution $=T_1$
Residual error after trim $=+T_1/2$

In the improved circuit of FIG. 4, since each trim is not independent but is dependent upon the prior trim, the weighting of the trim increments must be equal rather than binary. Thus, a single trim pad using the multi-zap circuit of FIG. 4 should be designed for 3 equal trims of $T_1$, providing a trim range of $3T_1$ and a resolution of $T_1$.

It is possible of course to replicate the multi-zap circuit in order to increase the overall range accomplished by the trimming circuit. To do so, the individual multi-zap circuits may be either connected in cascade, or parallel connected. The range is then increased more than proportionally to the number of circuits employed.

A comparison with existing trim techniques illustrates the advantage of the method of the present invention over that of the prior art. First, comparing the simplest configurations, if a single bond pad is to be employed, the multi-zap method of the present invention will provide a 3 to 1 advantage in trim range over that obtainable with the conventional technique, as described above.

However, if a larger number of pads are to be employed, say for example 3 pads, then the range advantage of multi-zap becomes more pronounced, based upon the fact that if three independent multi-zap circuits are employed, the first will be weighted $T_1$ with a range of $3T_1$, the second at $4T_1$ with a range of $12T_1$ and the third at $16T_1$ with a range of $48T_1$. The total range resulting from 3 pads is then $63T_1$ compared to a range of $7T_1$ for 3 independent zaps using the prior art scheme of FIG. 1.

FIG. 5 shows an experimental circuit used to verify the multi-zap circuit approach. Three minimum geometry NPN vertical transistors, all integrated on a common substrate, were connected as shown in FIG. 5a, with the collector $Q_1$ and $Q_3$ left floating, simulating the circuit of FIG. 4 without the trim resistance elements. The circuit shown in FIG. 5b was connected to a 75 volt power supply, so that 0.47 microfarad capacitor $C_1$ could be charged to 75 volts through a 10 Kilohm resistor $R_{10}$. Initially, the polarity is selected positive with switch 1 in position A. By closing switch $S_1$ a high current is caused to flow from the charged capacitor through resistor $R_9$ and the through the multi-zap circuit to ground. Resistor $R_9$ is employed to control the limit of the current peak applied to the circuit. In the test circuit of FIG. 5, the first test point, TP1, corresponds to the junction among $R_7$, the anode of $Z_1$, and the base of $Z_2$ in FIG. 4. The second test point, TP2, corresponds to the junction among $R_6$, the cathode of $Z_3$, and the emitter of $Z_2$ in FIG. 4. The third test point, TP3, corresponds to Pad 1 in FIG. 4. The fourth test point, TP4, functions as the common of the circuit, and corresponds to Pad 2 in FIG. 4.

The resistance from each test point was measured before and after the first zap.

A second zap was then performed by reversing the polarity of the 75 volt battery using $S_1$, followed by a closing of $S_2$.

Finally, a third zap was accomplished by returning the battery to its original polarity by $S_1$ followed by a closing of $S_2$. The test results following each individual zap are as shown in Table I.

TABLE I

| Resistance from terminal: | Before Zap 1 | After Zap 1 | After Zap 2 | After Zap 3 |
|---|---|---|---|---|
| 3 to 4 | open | 18 ohm | 18 ohm | 18 ohm |
| 1 to 4 | open | open | 600 ohm | 600 ohm |

TABLE I-continued

| Resistance from terminal: | Before Zap 1 | After Zap 1 | After Zap 2 | After Zap 3 |
|---|---|---|---|---|
| 2 to 4 | open | open | open | 10 ohm. |

This experiment was performed using several devices, with the results shown in Table I being typical. The primary observation is that the after-zap resistance resulting from zap 2 on device $Q_2$ is relatively high compared to the after-zap resistance of $Q_1$ and $Q_3$. It was discovered that the after-zap resistance of $Q_2$ could be reduced to near 300 ohms by repeating the zap two or three times. This leads one to believe that an optimization of the zap current by different voltage, $C_1$ or $R_9$ values could be more effective in producing a lower after-zap resistance for $Q_2$. However, in most practical trim circuits, the after-zap resistance of the zap devices can be included in the resistors $R_6$, $R_7$ and $R_8$ in the multi-zap circuit of FIG. 4. For example if the desired values of $R_7$ is 3K and the after zap resistance of $Z_2$ is 600 ohms, then $R_7$ would be adjusted to 2.4K to produce the desired result.

The trim circuitry described above may be rendered in integrated circuit form by conventionally diffusing three discrete NPN transistors into a substrate, and interconnecting the three to form the circuit of FIG. 4. An advantage in area savings may be obtained however by using a unique layout of the active elements as shown in FIG. 6.

In FIG. 6, there is shown a special device geometry for integrated circuit implementation of the active devices called for in the multi-zap circuit of FIG. 4. Although the basic invention as described earlier is useful and has practical implementation using three separate NPN zap devices, the use of the special devices shown in FIG. 6 will provide a further advantage in area savings.

The special geometry is intended to provide the same function as would individual fabrication of the three devices $Z_1$, $Z_2$ and $Z_3$ of FIG. 4, but is integrated within a smaller area on a silicon chip. In the figure, FIG. 6a depicts the metal interconnect while FIG. 6b depicts the isolation, base and emitter diffusions necessary to make the device. The figures are not necessarily to scale, but show only the relative positioning of the devices which makes possible the desired reduction of area which is consumed on the chip.

In FIG. 6a, the metal interconnect which provides the electrical connection points for the elements shunted by the zap circuit and the zap pads is shown. FIG. 6b shows the diffusion area within the isolation pocket. Isolation pocket 60 may be placed at the desired position for the trim circuit in accordance with conventional microcircuit design techniques. Within the isolation pocket 60 are located two base diffusion areas, 61 and 62. Within the first base diffusion region 61 are located two emitter diffusions 63 and 64. This first base diffusion 61 and the two emitter diffusions 63 and 64 and provide the base-emitter junctions of two transistors. The first transistor, corresponding to $Z_2$ of FIG. 4, consists of emitter diffusion 63, base diffusion 61 and the collector 65 formed by the isolation pocket and base diffusion. The second transistor, corresponding to $Z_1$ of FIG. 4., consists of emitter diffusion 64, base diffusion 61 and the collector formed by the isolation pocket and base diffusion. Thus, the base and collector junctions are common, while the emitters are separate. It will be noted that the collector of the second transistor, which corresponds to $Z_1$ of FIG. 4., performs no function.

The third transistor, corresponding to $Z_3$ of FIG. 4., consists of emitter diffusion 65, base diffusion 62, and the collector formed by the isolation pocket 60 and base diffusion 62.

Connection to the remainder of the circuit, including the trim elements is done in accordance with the interconnect diagram of FIG. 6a. Note that the interconnection requires but two pads in order to accomplish all of the functions described in the above text.

The multi-zap geometry of FIGS. 6a and 6b is, in essence, a merged device consisting of two individual bases, and three separate emitters, all in a common isolation pocket. The area savings of this device over three individual devices will be 2 or 3 to one, due to the fact that it requires only a single isolation pocket.

It will be appreciated that although particular embodiments of the invention disclosed herein have been described, many additional modifications and variations will be apparent to those skilled in the art in light of the above teachings. It is intended that all such modifications and variations be included within the scope of this invention, which scope is limited only by the following claims.

What is claimed is:

1. A device for permanently effecting the adjustment of critical circuit elements of an electrical circuit, said critical elements having a first and a second terminal, by means of shunting the critical element with selectable trim elements through selective short-circuiting of fusible elements by application of a waveform of electrical current externally applied to two electrical contacts, comprising: a first and second fusible element, each element having a base and an emitter, and having characteristics such that, before application of a current waveform of specified polarity and magnitude, each fusible element has a relatively high conductance when the base and emitter are forward biased, and a relatively low conductance when the base and emitter are reverse biased and, after a waveform of specified polarity and magnitude is applied to the element, having conductance which is relatively high and substantially equal whether the base and emitter are forward or reverse biased, the first fusible element base being connected to the second fusible element base, the emitter of the first fusible element being connected to the first electrical contact and to the first terminal of the critical element, and the emitter of the second fusible element being connected to the second of the electrical contacts;

a first trim element, having a preselected value, said trim element having a first terminal connected to the junction between the first and second fusible elements and having a second terminal connected to the second terminal of the critical circuit element, and;

a second trim element, having a preselected value, said trim element having a first terminal connected to the emitter of the second fusible element and having a second terminal connected to the junction of the first trim element with the second terminal of the critical circuit element.

2. A device for permanently effecting the adjustment of critical circuit elements of an electrical circuit, said critical elements having a first and a second terminal, by means of shunting the critical element with selectable trim elements through selective short-circuiting of fusible elements by application of a waveform of electrical current externally applied to the device by means of two electrical contacts, comprising: a first, second, and third fusible element, each element having a base and an emitter, and having characteristics such that, before application of a current waveform of specified polarity and magnitude, the fusible element has a relatively high conductance when the base and emitter are forward biased, and a relatively low conductance when the base and emitter are reverse biased, and, after a waveform of specified polarity and magnitude is applied to the fusible element, having conductance which is relatively high and substantially equal whether the base and emitter are forward biased or reverse biased, the second fusible element further comprising a collector, and having the characteristics that, before application of a current waveform of specified polarity and magnitude, forward biasing the base and emitter and causing a current flow to occur in the base and emitter allows a larger current to flow through the collector and emitter of the element and, after a waveform of specified polarity and magnitude is applied to the fusible element, having conductance which is relatively high and substantially equal through the base and emitter, whether the base and emitter are forward biased or reverse biased, the first fusible element base being connected to the second fusible element base, the emitter of the first fusible element being connected to the first electrical contact and to the collector of the second fusible element, the emitter of the second fusible element being connected to the emitter of the third fusible element, the base of the third fusible element being connected to the second electrical contact and to the second terminal of the critical circuit element;

a first trim element, having a preselected value, said element having a first terminal connected to the junction between the emitter of the first fusible element with the collector of the second fusible element, and having a second terminal connected to the first terminal of the critical circuit element;

a second trim element, having a preselected value, said trim element having a first terminal connected to the base of the first and to the base of the second fusible elements and having a second terminal connected to the junction of the first trim element and the first terminal of the critical circuit element;

a third trim element, having a preselected value, said element having a first terminal connected to the emitter of the second fusible element and the emitter of the third fusible element and having a second terminal connected to the junction of the first trim element, the second trim element, and the first terminal of the critical circuit element.

* * * * *